United States Patent [19]
Cline et al.

[11] 3,983,051
[45] Sept. 28, 1976

[54] DOPED BERYLLIUM LANTHANATE CRYSTALS

[75] Inventors: Carl F. Cline, Mendham; Robert C. Morris, Flanders, both of N.J.

[73] Assignee: Allied Chemical Corporation, Morris Township, N.J.

[22] Filed: Aug. 22, 1974

[21] Appl. No.: 499,720

Related U.S. Application Data

[62] Division of Ser. No. 422,450, Dec. 6, 1973, Pat. No. 3,866,142.

[52] U.S. Cl. ........................................... 252/301.4 R
[51] Int. Cl.² ........................................... C09K 11/46
[58] Field of Search ........................... 252/301.4 R; 331/94.5 F

[56] References Cited
UNITED STATES PATENTS

| | | | |
|---|---|---|---|
| 3,503,006 | 3/1970 | Hoskins et al. | 252/301.4 R X |
| 3,725,811 | 4/1973 | Murphy | 252/301.4 R X |

OTHER PUBLICATIONS

Voromko et al., "Chem. Abstracts," vol. 79, 1973, p. 36758y.
Kuo et al., I "Chem. Abstracts," vol. 62, 1965, p. 3452d.
Kuo et al., II "Chem. Abstracts," vol. 63, 1965, p. 10743f.

*Primary Examiner*—Jack Cooper
*Attorney, Agent, or Firm*—David W. Collins; Ernest A. Polin

[57] ABSTRACT

Novel single crystals of doped beryllium lanthanate having up to 50 atomic percent dopant substituted for lanthanum are provided which find advantageous use in optical applications and, in particular, as laser hosts.

3 Claims, 4 Drawing Figures

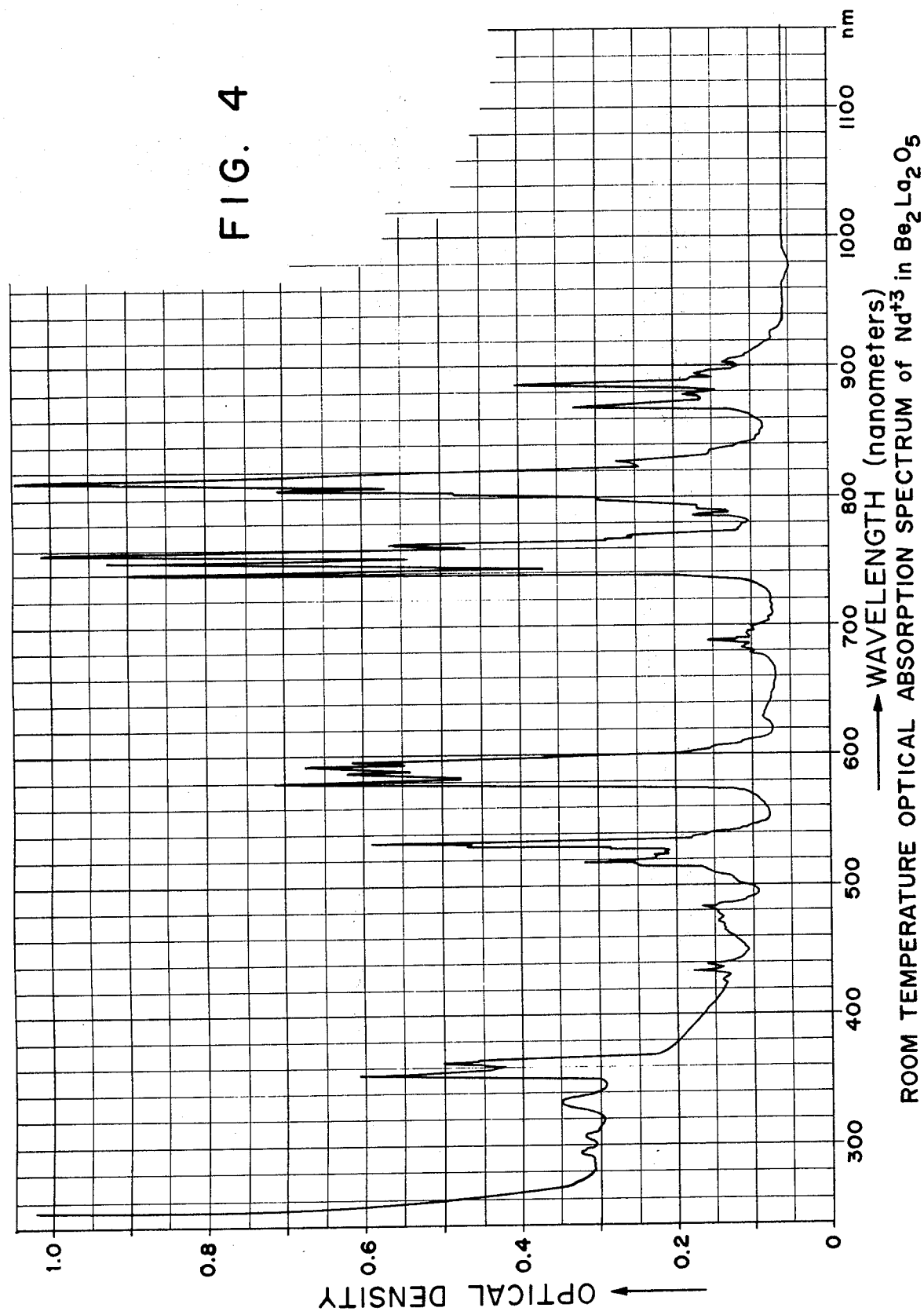

DOPED BERYLLIUM LANTHANATE CRYSTALS

This is a division of Application Ser. No. 422,450 filed Dec. 6, 1973 now U.S. Pat. No. 3,866,142 issued Feb. 11,1975.

BACKGROUND OF THE INVENTION

1. Field of the Invention

This invention relates to single crystals and more specifically to single, doped beryllium lanthanate crystals and to the use of such crystals as laser hosts.

2. Description of the Prior Art

The use of lasers in science and industry has received wide acceptance in an ever increasing variety of applications. Lasers have found use in such diverse areas as range finding apparatus, optical surgery and metal drilling. Briefly, lasers operate on the principle of light amplification through stimulated emission of radiation and can create extremely intense concentrations of light. The light beam produced in the laser cavity is amplified in a laser host material. Materials which have been used as laser hosts include gases, liquids, glasses and single crystalline solids.

When single crystalline solids are utilized as laser hosts the crystals are generally in the form of elongated rods. The structure of the crystalline material must be very nearly perfect since any optical inhomogeneities will cause distortion and scattering of the laser beam and thereby reduce the intensity and coherence of the radiation. Imperfections in the crystal which adversely affect lasing performance include misorientations, chemical concentration gradients, dislocations, inclusions and bubbles.

Material of potential or realized commercial importance as rare-earth ion laser hosts include $Y_3Al_5O_2$:Nd (YAG:Nd) and $Y_2Al_2O_6$:Nd (YALO) as well as the fluoroapatite (FAP) and silicate oxyapatite (SOAP) based materials and some variations of these. YAG:Nd has so far realized the largest commercial application among these materials because of its favorable combination of spectroscopic, thermal transport and stress-optic properties. It is, however, difficult and expensive to grow, especially at high doping levels.

SUMMARY OF THE INVENTION

This invention relates to single, doped beryllium lanthanate crystals which have novel and advantageous properties.

In the doped beryllium lanthanate crystals of the present invention not more than 50 atomic percent of the lanthanum sites may be occupied by dopant; and thus the doped beryllium lanthanate crystals of the present invention may contain up to 50 atomic percent dopant substituted for the lanthanum. Preferred compositions are those having the general formula $Be_2La_{2-2x}Z_{2x}O_5$ wherein Z is a dopant selected from the group consisting of prasedymium, neodymium, samarium, europium, gadolinium, terbium, dysprosium, holmium, erbium, thulium, ytterbium, and mixtures thereof and wherein $x$ is a positive value not greater than about 0.2, and is preferably from about 0.001 to 0.2, which may be employed as laser hosts. Especially preferred as laser hosts are beryllium lanthanate crystals of the present invention wherein the dopant is neodymium, The crystals of the instant invention may be grown by any standard crystal growing technique, such as melt growth techniques, including the Czochralski method, the Verneuil method or the Bridgman-Stockbarger method, of which the Czochralski method, described in an article by J. Czochralski in Zeitschrift fur Physikalische Chemie, Vol. 92, pages 219–221 (1918) and more recently described in an article by K. Nassau and L. G. VAn Uitert, Journal of Applied Physics, Vol. 31, page 1508 (1960), is preferred. In accordance with this method, a melt is formed from a mixture of initial ingredients, the composition of the melt controlling the composition of the growing crystals. A seed crystal is inserted into the melt and simultaneously rotated and slowly withdrawn, thereby promoting crystal growth onto the seed crystal.

Single crystals of laser host materials have also been obtained by the Verneuil technique which involves the dropping of flame-fused powdered material onto the molten cap of a seed rod whereupon the seed material is solidified along the bottom of the molten cap so as to increase the length of the seed rod. The seed rod is slowly lowered so as to maintain the molten surface of the cap at a substantially constant distance from the heat source. Other growth methods, such as the Bridgman-Stockbarger method, are well known to those skilled in the art.

The advantages achieved by the beryllium lanthanate crystals of the present invention may be illustratively compared by reference to YAG:Nd which is widely used as a laser host.

Higher dopant (indicated by Z in the above formula) concentrations are possible in such beryllium lanthanate crystals than have heretofore been obtained with YAG:Nd. Beryllium lanthanate crystals of the present invention are softer than the traditional YAG:Nd crystals; this permits easier and faster machining of the crystals to produce the desired crystal product.

Further, the beryllium lanthanate crystals of the present invention are optically biaxial, being monoclinic in crystal structure, and in addition have been found to be capable of emitting linearly polarized radiation when employed as a laser host. Thus, where polarized radiation is desired, it is possible to extract linearly polarized radiation from the beryllium lanthanate crystals of the present invention without the necessity of additional constraining optics, e.g. a polarizer, thereby avoiding any losses of power associated with the use of such additional constraining optics.

In addition, both pulsed and continuous wave (c.w.) operation at room temperature have been achieved employing a doped beryllium lanthanate crystal of the present invention as a laser host, thereby broadening the utility of such crystals.

Single beryllium lanthanate crystals of high optical quality may be grown from the melt at a rate which is significantly greater than the rate of growth possible in the melt growth of VAC:Nd crystals. This fact is most significant economically since more rapid growth rate translates into a more efficient use of the growth apparatus and its supportive equipment. Further, crystals of doped beryllium lanthanate may be grown at a temperature lower than that required with YAG:Nd, thus resulting in decreased power costs and fewer crucible losses. Finally, the undesirable core of material that is traditionally obtained in the growth of YAG:Nd crystals is absent or relatively minimal in the growth of crystals of the present invention, thereby effecting a substantial decrease in waste material.

BRIEF DESCRIPTION OF THE DRAWING

FIG. 4 is the optical absorption spectrum of a specific $Nd^{+3}$ doped beryllium lanthanate crystal of the present invention, i.e. $Be_2La_{1.987}Nd_{0.013}O_5$.

DETAILED DESCRIPTION OF THE INVENTION

Figure 1:
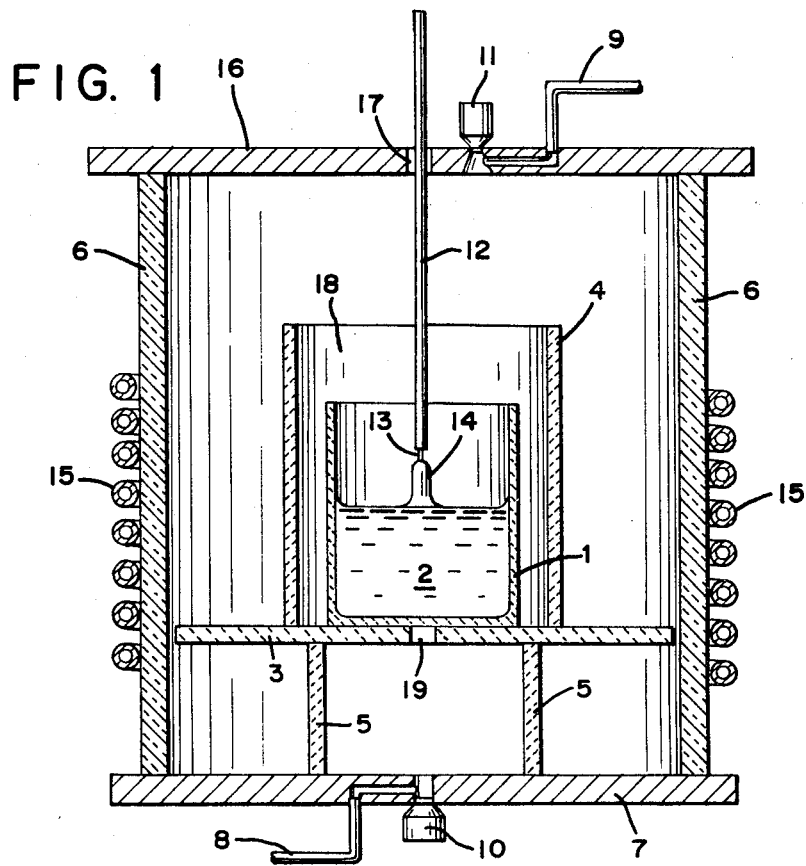
FIG. 1 is an elevation view, partly in cross-section, of the apparatus for carrying out the preferred melt growth process for producing the novel doped beryllium lanthanate single crystals of this invention.

According to the present invention, single crystals of doped beryllium lanthanate are provided having up to 50 atomic percent dopant ions substituted for lanthanum. Preferred crystals of the present invention are those having the formula $Be_2La_{2-2x}Z_{2x}O_5$ wherein Z is a dopant selected from the group consisting of praseoodymium, neodymium, samarium, europium, gadolinium, terbium, dysprosium, holmium, erbium, thulium, ytterbium, and mixtures thereof and wherein $x$, which represents the fraction of lanthanum sites in the crystal structure which are occupied by the Z ions, is a positive value not greater than about 0.2, and is preferably from about 0.001 and 0.2, and most preferably from about 0.007 to 0.015. Other possible dopants include the transuranic elements, i.e., the actinides such as actinium, thorium and the like. Examples of doped beryllium lanthanate crystals of the present invention are set forth in the following Table:

TABLE I

| Crystal Formula | Atomic Percent Dopant (a/o) |
|---|---|
| $Be_2La_{1.998}Pr_{0.002}O_5$ | 0.1 |
| $Be_2La_{1.994}Nd_{0.006}O_5$ | 0.3 |
| $Be_2La_{1.872}Sm_{0.018}O_5$ | 0.9 |
| $Be_2La_{1.97}Eu_{0.03}O_5$ | 1.5 |
| $Be_2La_{1.95}Gd_{0.05}O_5$ | 2.5 |
| $Be_2La_{1.89}Tb_{0.11}O_5$ | 5.5 |
| $Be_2La_{1.79}Dy_{0.21}O_5$ | 10.5 |
| $Be_2La_{1.69}Ho_{0.31}O_5$ | 15.5 |
| $Be_2La_{1.8}Er_{0.2}O_5$ | 10.0 |
| $Be_2La_{1.6}Tm_{0.4}O_5$ | 20.0 |
| $Be_2La_{1.996}Yb_{0.004}O_5$ | 0.2 |
| $Be_2La_{1.984}Nd_{0.016}O_5$ | 0.8 |
| $Be_2La_{1.826}Eu_{0.174}O_5$ | 8.7 |

The term "single crystals" of beryllium lanthanate is herein meant to define crystals having a minimum lineal cross-sectional dimension of about 0.01 inch and a minimum lineal longitudinal dimension of about 0.2 inch. While crystals commercially employed as laser hosts are normally at least 0.1 × 1.0 inch in dimension, this should not be considered limiting. Thus, the crystals of the present invention employed as laser hosts are limited in size only in that they must be single crystals, as such term is herein defined. Where the doped beryllium lanthanate single crystals of the present invention are employed as laser hosts, it is preferred that such crystals be of high optical quality, that is, such crystals should be almost totally free of defects such as bubbles, strain, metallic or non-metallic oxide second phase inclusions and low angled grain boundaries and should generally contain no more than about 10 ppm by weight of impurities, and most preferably no more than about 5 ppm. In addition, the single crystals of doped beryllium lanthanate of high optical quality which are preferably employed as laser hosts may generally be characterized as being defect- and impurity-free to the extent that optical losses caused by such defects and impurities are not greater than about 0.005/cm, and preferably no greater than about 0.003/cm.

Impurities which are desirably avoided include metallic ions such as strontium and mercury which possess ionic radii similar to that of lanthanum ions but which have valences which differ from the +3 valent state of the lanthanum ions. The relative absence of such impurities is important since they can create color centers which interfere with laser action by dissipating pump energy as heat or by radiating energy at non-lasing wave lengths.

As has been previously mentioned, while various methods may be employed to obtain the doped beryllium lanthanate single crystals of the present invention, the Zzochralski melt growth method is preferred. It should be recognized, however, that may many of the process parameters given below (such as starting material purity and close temperature control) which have been found inportant in the growth of high optical quality crystals using the Czochralski technique are also important when alternative methods are employed to obtain such crystals.

In the growth of a single crystal of doped beryllium lanthanate of the present invention, the starting materials, i.e. $La_2O_3$, BeO and dopant, are placed in a suitable refractory container or crucible and are heated until the mixture is molten. The desired dopant (Z) may be added as a dopant-compound selected from the group consisting of $Z_2O_3$, $Z_2(CO_3)_3$ and $Z(NO_3)_3$ or mixtures thereof. In order to obtain doped beryllium lanthanate crystals of high quality it is, of course, necessary to employ starting materials of high purity. Thus, to obtain the high quality crystals of the present invention the starting materials should contain no more than the following maximum concentrations of impurities, indicated in parts by weight based on the starting material: $La_2O_3$, 50 ppm impurities, and preferably 10 ppm; BeO, 100 ppm impurities, and preferably 10 ppm; and dopant compound, 20 ppm impurities and preferably 10 ppm.

It is well known in the melt growth of many crystals, as for example YAG:Nd, that an excess of the selected dopant over that quantity of dopant desired in the crystal must be employed in the melt so as to obtain a crystal of the desired dopant concentration. The required excess of dopant, of course, varies with the dopant which is selected for use. For example, since the distribution coefficient for the melt growth of $Be_2La_{2-2x}Z_{2x}O_5$ wherein Z is Nd is about 0.66, about 1.52 times the desired dopant concentration in the crystal must be employed in the melt in order to obtain the desired dopant concentration in the grown crystal. Of course, since the melt becomes enriched with dopant during growth of a crystal therefrom, the grown crystal will vary in atomic percent dopant composition over the length of the growth crystal, the amount of this variation in atomic percent dopant composition for a given crystal increasing with an increase in the percent of the melt which will be incorporated in the grown crystal. Thus, for a given single crystal of doped beryllium lanthanate of the present invention, the atomic percent dopant contained therein is herein meant to define the average dopant composition of the crystal.

The container or crucible is constructed of refractory material having a melting point higher than the melting point of the starting material mixture. Additionally, the crucible should be able to withstand thermal shock and be substantially chemically inert to the molten starting material. While many substances may be employed as crucible material, tungsten and iridium are preferred, with iridium being the most preferred. It is preferred that an inert atmosphere be maintained around the crucible to minimize the likelihood of oxidation of crucible materials and the consequent entrainment of metallic inclusions into the melt which act as optical scattering centers in the grown crystal, thereby decreasing its usefulness as a laser host. Such atmosphere can comprise an inert gas, for example, argon, helium, neon, krypton or nitrogen.

Where $Z_2(CO_3)_3$ and/or $Z(NO_3)_3$ are employed in the starting material mixture as the dopant compound, the application of heat sufficient to melt the mixture results in the decomposition of the carbonate and/or nirate dopant compound to the corresponding dopant oxide, $(Z_2O_3)$, accompanied with the evolution of carbon dioxide and/or nitrogen oxides. While the presence of carbon dioxide and/or nitrogen oxide gases above the surface of the melt does not prevent the growth of high quality doped beryllium lanthanate crystals, in any case the decomposition of the carbonate or nitrate dopant compound is substantially complete prior to initiation of crystal growth due to the length of time required to achieve a melt from the solid starting materials. Thus, substantially complete evolution of such gases from the melt results, thereby minimizing the number of bubbles which may form in the growing crystal upon initiation of crystal growth.

The temperature to which the solid starting materials should be heated to form a melt, of course, varies depending on the selection of the particular dopant compound employed but is generally between about 1370° and 1450°C. Heating of the starting material to the desired melt temperature is preferably accomplished by inductive electrical heating. Other methods of heating can be employed, however, if they are readily controllable and do not contaminate the growing environment of the crystal. In the inductive heating technique the crucible is employed as a susceptor in an alternating electric field. Currents are induced in the susceptor crucible and thus heat the crucible to a high temperature, whereby the contained starting material is heated by conduction and radiation. Inductive heating can be employed at atmospheric pressure or at pressures above or below atmospheric. Alternatively, the crucible can be heated by direct application of electrical potential and thus cause resistance currents to pass through the crucible. The crucible may also be heated by radiation from resistance heating elements such as SiC Globars or resistance wires of noble or refractory metals. It is of extreme importance in all these heating techniques to guard against contaminating the crystal growing environment and means should be provided as well to allow for the introduction and maintenance of the desired atmosphere above the melt. Once the starting material becomes molten, convection currents within the melt tend to stir the melt and homogenize the melt composition.

A single crystal seed having desired composition and desired crystal orientation is then placed in contact with the surface of the melt. While suitable seeds may include beryllium lanthanate and platinum or iridium wire, the seed preferably has the same composition as that of the desired single crystal product. A small portion of the seed melts and a temperature gradient is established between the solid portion of the seed and the melt. The seed is then slowly rotated and withdrawn from the melt while material from the melt solidifies at the interface between the solid crystal and the melt. The temperature gradient in the solid phase immediately adjacent to this interface is maintained at a value which enables desired growth conditions to be obtained. As the seed is withdrawn, an elongated single crystal is grown.

The growth of the doped beryllium lanthanate crystals of the present invention by the Czochralski technique may be effected in any of the standard apparatus employed for melt growth of crystals using this technique. Typical of such apparatus is the water-cooled induction heating apparatus illustrated in FIG. 1. Molten starting material 2, comprising, for example, BeO, $La_2O_3$, and $Nd_2O_3$, is introduced into crucible 1, which is fabricated as for example, of iridium, and which rests on insulating plate 3 supported by insulated support members 5. Crucible 1 is surrounded by insulating sleeve 4 which preferably extends above the rim of crucible 1 so as to reduce the vertical thermal gradient and, hence, the heat loss from melt 2. Insulating plate 3, insulating sleeve 4 and insulated support members 5 may all be fabricated from a refractory insulating material, as for example zirconia.

Crucible 1, together with insulating elements 3, 4 and 5, are housed in cylinder 6, which may for example be either a quartz glass or Vycor tube, having end plates 7 and 16, thereby defining cavity 18. End plates 7 and 16 are provided with optical pyrometer sighting ports 10 and 11, respectively, to allow observation of melt 2 during operation. Observation of melt 2 by use of port 10 is made possible by the provision of opening 19 in insulating plate 3. End plates 7 and 16 are also provided with gas tubings 8 and 9, respectively, to pass gas into cavity 18 and to prevent solids from depositing in ports 10 and 11 and thereby interfering with observation through these ports.

In operation, the desired temperature of melt 2 is maintained by water-cooled heating coils 15. Seed rod 12, to which seed 13 is attached, is lowered through opening 17 in end plate 16 until seed 13 contacts the surface of melt 2. The subsequent growth of the single neodymium-doped beryllium lanthanate crystal 14 is effected by simultaneously slowly rotating and withdrawing the seed rod 12 and seed 13 so as to form growing crystal 14 thereon. Seed rod 12 is preferably made from a thermal shock resistant refractory material such as $Al_2O_3$ or BeO. Seed rod 12 is rotated and vertically translated by a conventional lead screw-type pulling mechanism. Inert gas, e.g. nitrogen, is introduced into cavity 18 through either gas tubing 8 or 9, the other gas tubing serving as the exit to allow continuous pass-through of fresh inert gas where desired.

To obtain high quality crystals it is preferred that the melt temperature be precisely controlled during the growth of the crystal to within ±0.5°C. of the set temperature in order to avoid the formation of inhomogeneities in the growth crystal, such as bubbles and stress concentrating surface flaws which could later result in crystal fracture during cooling. This temperature control may be accomplished by known means, such as by controlling the generator power output with a precision, three mode temperature controller, the input of which is the melt or crucible temperature as measured by a silicon optical pyrometer.

After a completely molten charge is obtained, the temperature is adjusted to the desired initial growth temperature, which of course varies, depending on the particular dopant employed, but is generally between 1370° and 1450°C. For example, the initial growth temperature for the growth of neodymiumdoped beryllium lanthanate single crystals is 1400°C. The seed is then slowly lowered into contact with the melt surface. Pulling of the crystal is then begun and during the initial growth period the temperature of the melt is slowly reduced from the initial growth temperature by approximately 20°C. in order to gradually increase the crystal diameter. After the desired crystal diameter is attained, the melt temperature at the crystal-melt interface is held substantially constant for the remainder of growth. For the growth of the selected beryllium lanthanate crystal the maximum pulling rate can be determined by the onset of the formation in the crystal of defects, such as bubbles, voids, or inclusions in the crystal. Thus, for example, when single crystals of neodymium-doped beryllium lanthanate of high optical quality are desired, the pulling rate must generally be less than about 0.5 inch per hour.

The rate of rotation of the seed rod and growing crystal may be generally between 10 and 60 rpm and preferably between 20 and 50 ppm. The rotation rate for the growth of a crystal of a given diameter and doping level is generally selected so as to produce a flat crystal-melt interface. This selected rotation rate will increase with decreasing crystal diameter and decreasing doping level. For example, a crystal rotation rate of 40 rpm is found to produce a nearly flat interface on 20 mm diameter crystals containing 0.7 a/O $Nd^{+3}$ substituted for $La^{+3}$ sites.

As is well known to those skilled in the art, solid state lasers operate on the principle of light amplification through stimulated emission of radiation. The active ions utilized in the lasers of this invention are dopants selected from the group consisting of praseodymium, neodymium, samarium, europium, gadolinium, terbium, dysprosium, holmium, erbium, thulium, ytterbium, and mixtures thereof, in the trivalent (+3) state. While the precise configuration of the components of a laser varies widely, a typical laser in which the doped beryllium lanthanate crystals of the present invention may be employed as a laser host is illustrated in FIG. 2.

Figure 2:
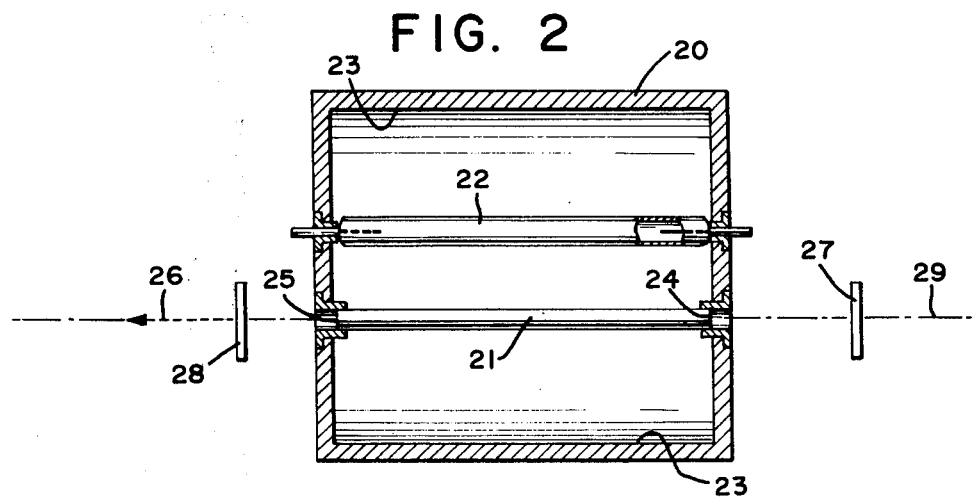
FIG. 2 is a diagrammic illustration in elevation of a typical laser apparatus employing the beryllium lanthanate crystals of the present invention as a laser host.

Referring to the optically pumped laser illustrated in FIG. 2, laser host 21 consisting of a doped beryllium lanthanate crystal of the present invention, and pumping source 22, e.g. a xenon gaseous discharge pumping source, are housed in container 20 which has a highly reflective inner surface 23 and which defines an elliptical cavity, each at a focal point of the ellipse formed by container 20. Laser host 21 is provided with coated ends 24 and 25, having a conventional dielectric antireflection coating. Completely reflecting mirror 27 and partially reflecting mirror 28 are positioned external to container 20 about cylindrical axis 29 of rod 21. Lasing action is evidenced by emission, shown as arrow 26, which emanates from partially reflecting mirror 28. Alternatively, ends 24 and 25 may be coated with a conventional reflectance coating to provide partially reflecting end 25 and completely reflecting end 24.

Figure 3:
FIG. 3 is a view of a rod fabricated from a single, doped beryllium lanthanate crystal of the present invention useful as a laser host.

FIG. 3 illustrates a rod 30 fabricated from a single crystal of doped beryllium lanthanate of the present invention, having flat, parallel, polished ends. The device of FIG. 3 acts to amplify within the rod coherent radiation 31 which passes out the other end of the rod as emitted radiation 32.

The optically pumped lasers employing the single crystals of doped beryllium lanthanate of the present invention as laser hosts may utilize any suitable optical pumping source, either in pulsed or continuous mode. Examples of suitable optical pumping sources include: gaseous discharge pumping sources, such as gaseous discharge pumping sources employing xenon, krypton or mixtures thereof; coherent and incoherent semi-conductor diode emitters such as gallium arsenide and gallium phosphide; and metallic vapor sources such as cesium, rubidium, potassium and combinations thereof.

FIG. 4 is a room temperature (300°K.) optical absorption spectrum for a b-axis single crystal of $Be_2La_{1.987}Nd_{0.013}O_5$ having a thickness of 3 mm. The measurements for FIG. 4 were taken on a Cary 14 double beam spectrophometer with an output recording trace in optical density units. The crystal employed for this measurement contained 0.8 a/o dopant.

It should be noted that continuous lasing with a beryllium lanthanate crystal of the present invention containing 0.8 a/o dopant has been observed for a b-axis rod at an output wave length of 1,070 nanometers.

While reference has been made to the use of crystals having a b-axis orientation, the crystals of the present invention which are employed as laser hosts need not be so limited and may be also used in other orientations.

The present invention may be further illustrated by reference to the following examples wherein parts are by weight unless otherwise indicated.

EXAMPLE 1

A starting material consisting of 50.02 parts BeO together with 322.5 parts $La_2O_3$ and 3.36 parts $Nd_2O_3$ is placed in an iridium crucible which is then placed in an enclosed water-cooled induction heating apparatus as illustrated in FIG. 1. The starting material is heated to 1,400°C. to form a melt over the surface of which an atmosphere of nitrogen is employed. A seed rod composed of $Al_2O_3$ and having as a seed a crystal of b-axis beryllium lanthanate is brought into contact with the surface of the melt, slowly rotated and simultaneously withdrawn. A pulling rate of 0.10 inch per hour and a rotation rate of 40 rpm is maintained for a period of 50 hours. At the end of this period, a single, neodymium doped beryllium lanthanate crystal having the average composition $Be_2La_{1.985}Nd_{0.015}O_5$ and having a linear dimension of 5.75 inches and a cross-sectional dimension of 0.8 inch is obtained. Analysis of the resulting single crystal shows it to be substantially free of metallic inclusions and other optical defects, as evidenced by the visual nonobservance of scattering, bubbles and cracks.

EXAMPLE 2

A rod of dimensions 5 × 50 mm is fabricated from the single b-axis crystal of $Be_2La_{1.985}Nd_{0.015}O_5$ grown from the melt in Example 1. This rod is placed in an optically pumped laser, such as is illustrated in FIG. 2, having a highly reflective inner surface and a pulsed xenon flash lamp of approximately 5 × 50 mm in dimension together with highly reflecting external flat microns aligned along the cylindrical axis of the rod at a 30 cm spacing between the mirrors. The lamp is fired at approximately 10 joules input per flash, upon which lasing action is immediately observed. A 90 percent Reflectance output mirror is then placed at the output end and a series of output measurements is made at several input energy settings. A threshold value of 12 joules is recorded and a linear slope efficiency of 0.3% is observed. The highest output under pulsed xenon operation is 431 millijoules for an input of 200 joules. A single pass insertion loss figure of about 0.005 per centimeter is observed.

EXAMPLE 3

A b-axis single crystal of $Be_2La_{1.985}Nd_{0.015}O_5$ is grown from a melt containing 50.02 parts BeO, 322.5 parts $La_2O_3$ and 3.36 parts $Nd_2O_3$ following the procedure set forth in Example 1. Analysis of the resultant single crystal shows it to be substantially free of metallic inclusions and other optical defects, as evidenced by the visual nonobservance of scattering, bubbles and cracks.

A rod of dimension 5 × 50 mm is fabricated from the above single crystal of $Be_2La_{1.985}Nd_{0.015}O_5$. This rod is placed in the optically pumped laser employed in Example 2. The pulsed xenon flash lamp is fired at approximately 10 joules input per flash, upon which lasing action is immediately observed. A 66 percent Reflectant output mirror is then placed at the output end and a series of output measurements is made at several input energy settings. A threshold value of 9.5 joules is recorded and a linear slope efficiency of 0.36% is observed. The highest output under pulsed xenon operation is 260 millijoules for an input of 90 joules. The output radiation is observed to be linearly polarized.

EXAMPLE 4

The b-axis rod of $Be_2La_{1.985}Nd_{0.015}O_5$ employed in Example 3 is placed in a double elliptical reflection pump chamber employing a pair of tungsten filament lamps. The rod is pumped in the chamber operating at a 3 kilowatt input and 6.2 watts of generated power is recorded employing a nominal 1.1 percent transmitting output mirror. Extrapolation from threshold measurements yields an insertion loss figure of 0.0025 per centimeter.

EXAMPLES 5–16

In each of the Examples 5–16 the meltgrowth procedure of Example 1 is followed, except that the parts of $La_2O_3$ and the selected dopant compound indicated in Table II below are substituted for the parts of $La_2O_3$ and $Nd_2O_3$ employed in Example 1. At the end of the period, a single, doped beryllium lanthanate crystal having the selected dopant element incorporated therein is obtained in each of the Examples 5–16.

TABLE II

| Example No. | $La_2O_3$ Parts | Dopant Compound | Dopant Compound Parts |
| --- | --- | --- | --- |
| 5 | 325.5 | $Sm_2O_3$ | 0.349 |
| 6 | 325.1 | $Eu_2O_3$ | 0.704 |
| 7 | 324.8 | $Er_2O_3$ | 1.15 |
| 8 | 323.2 | $Pr_2O_3$ | 2.64 |
| 9 | 320.9 | $Tb_2O_3$ | 5.49 |
| 10 | 317.7 | $Dy_2O_3$ | 9.32 |
| 11 | 307.9 | $Ho_2O_3$ | 20.78 |
| 12 | 305.0 | $Gd_2O_3$ | 23.20 |
| 13 | 297.5 | $Nd_2O_3$ | 29.27 |
| 14 | 293.2 | $Yb_2O_3$ | 39.41 |
| 15 | 291.6 | $Eu_2O_3$ | 36.95 |
| 16 | 275.3 | $Tm_2O_3$ | 59.81 |
| 17 | 260.6 | $Nd_2O_3$ | 67.29 |

We claim:
1. A single crystal of doped beryllium lanthanate having the formula $Be_2La_{2-2x}Z_{2x}O_5$ wherein Z is a dopant selected from the group consisting of praseodymium, neodymium, samarium, europium, gadolinium, terbium, dysprosium, holmium, erbium, thulium, ytterbium and mixtures thereof and wherein x is a positive value of about 0.001 to 0.2.

2. The single crystal of claim 1 wherein said dopant is neodymium.

3. The single crystal of claim 1 wherein $x$ is a positive value of about 0.007 to 0.015.

* * * * *